United States Patent [19]

Paquette et al.

[11] Patent Number: 4,960,640
[45] Date of Patent: Oct. 2, 1990

[54] COMPOSITE REFRACTORY MATERIAL

[75] Inventors: Edward L. Paquette, Claremont; Marc G. Simpson, Los Angeles, both of Calif.

[73] Assignee: Refractory Composites, Inc., Whittier, Calif.

[21] Appl. No.: 157,907

[22] Filed: Feb. 19, 1988

[51] Int. Cl.$^5$ ................................................ B32B 9/00
[52] U.S. Cl. .................................. 428/368; 427/248.1; 427/249; 427/250; 428/378; 428/379; 428/380; 428/381
[58] Field of Search ....................... 427/248.1, 249, 250; 428/368, 378, 379, 380, 381, 408

[56] References Cited

U.S. PATENT DOCUMENTS

| | | | |
|---|---|---|---|
| 4,596,741 | 6/1986 | Endou et al. | 428/408 |
| 4,663,230 | 5/1987 | Tennent | 427/249 |
| 4,772,513 | 9/1988 | Sakamoto et al. | 428/408 |

Primary Examiner—William J. Van Balen
Attorney, Agent, or Firm—Ellsworth R. Roston; Charles H. Schwartz

[57] ABSTRACT

A fibrous substrate having a first coefficient of thermal expansion and having porous characteristics is formed from discrete elements, such as carbon fibers, having anisotropic properties. A matrix formed from a refractory material encases the discrete elements and has a second coefficient of thermal expansion different from the first coefficient. The matrix has minimal chemical or mechanical bonding to the discrete elements to provide for a displacement of the matrix relative to the substrate with mechanical shock or changes in temperature. The matrix includes a first element having refractory properties and selected from the group consisting of hafnium, zirconium, tantalum, tungsten and molybdenum and also includes a second element bound to the first element. The matrix is preferably formed by providing a mixture of a first gas containing the refractory element and a second gas containing the second element and by introducing the gases into a chamber containing the substrate. The gases are introduced into the chamber at an elevated temperature and with a pressure pulsating at a particular rate between first and second pressure limits to obtain the deposition of the refractory material on the discrete elements. The gases are periodically exhausted from the chamber and fresh gases are introduced into the chamber. The matrix may consist of first and second layers respectively having hafnium (e.g. hafnium carbide) and zirconium (e.g. zirconium carbide) as the refractory materials. These layers define pores with the substrate and further define an external surface. A layer of rhenium may cover the matrix in the pores and in the external surface.

24 Claims, 4 Drawing Sheets

ZrC TUBE WOVEN SURFACE 200X

FIG. 8

ZrC TUBE WOVEN SURFACE 20X

FIG. 11

INDIVIDUAL CARBIDE
COATED FIBERS
1250X

FIG. 9

ZrC TUBULAR
CROSS-SECTION
80X

COMPOSITE REFRACTORY MATERIAL

This invention relates to refractory composite materials and to methods of producing such materials. More particularly, the invention relates to refractory composite materials which are hard, tough, dimensionally stable, resistant to corrosion and erosion and capable of operating satisfactorily through extended ranges of temperatures and which are formed from a refractory element selected from the group consisting of hafnium, zirconium, tantalum, tungsten and molybdenum. The method also relates to methods of producing such materials. The invention additionally relates to articles, particularly for use in the nuclear industry, made from such materials and to methods of producing such articles.

In recent years, a large and growing need has emerged for articles exhibiting a number of characteristics which are individually hard to achieve but which collectively have made attainment seem almost impossible. For example, the articles have been desired to be hard, tough, dimensionally stable and wear-resistant. The articles have also been desired to be resistant to corrosion and erosion and to acids and bases normally encountered in commercial and industrial environments. The articles have also been desired to provide these characteristics through ranges of temperature of several thousands of degrees fahrenheit. Articles impervious to a nuclear environment have also been desired with the characteristics discussed above.

A considerable effort has been made, and substantial sums of money have been expended, to provide articles which meet the above specifications. In spite of such efforts and such expenditures of money, problems have still remained. A suitable material has still not been provided which meets all of the parameters specified above. This has been particularly true with respect to products which are capable of operating satisfactorily for long periods of time in the nuclear industry.

In U.S. Pat. No. 4,397,901 issued to James W. Warren on Aug. 9, 1983, for "Composite Article and Method of Making Same" and assigned of record to the assignee of record of this application, a refractory composite material is disclosed and claimed which fulfills the parameters specified above. For example, the material disclosed and claimed in U.S. Pat. No. 4,397,901 is hard, tough, dimensionally stable, resistant to corrosion and corrosion and capable of operating satisfactorily through extended ranges of temperatures in excess of 2000° F. The material disclosed and claimed in U.S. Pat. No. 4,397,901 is also relatively light and is able to provide the characteristics discussed above even when produced in relatively thin layers.

This invention provides a combination of a matrix and a substrate, this combination having all of the characteristics specified above but having enhanced characteristics, particularly for certain uses, relative to the materials of U.S. Pat. No. 4,397,901. For example, the characteristics of the matrix may be harder and tougher, more resistant to corrosion and erosion and capable of operating through higher ranges of temperature than in the materials disclosed and claimed in U.S. Pat. No. 4,397,901. Combinations of the substrate and matrix of this invention are also capable of operating in a nuclear environment without losing any of the characteristics discussed above. This is particularly true when one of the materials in the matrix is zirconium carbide since zirconium carbide does not periodically absorb neutrons needed to continue the chain reaction.

In one embodiment of the invention, a fibrous substrate having a first coefficient of thermal expansion and having porous characteristics is formed from discrete elements, such as carbon fibers, having anisotropic properties. A matrix formed from a refractory material encases the discrete elements and has a second coefficient of thermal expansion different from the first coefficient. The matrix has minimal chemical or mechanical bonding to the discrete elements to provide for a displacement of the matrix relative to the substrate with mechanical shock or changes in temperature. The refractory material includes a first element having refractory properties and selected from the group consisting of hafnium, zirconium, tantalum, tungsten and molybdenum and also includes a second element bound to the first element.

The matrix is preferably formed by providing a mixture of a first gas containing the refractory element and a second gas containing the second element and by introducing the gases into a chamber containing the substrate. The gases are introduced into the chamber at an elevated temperature and with a pressure pulsating at a particular rate between first and second pressure limits to obtain the deposition of the refractory material on the discrete elements. The gases are periodically exhausted from the chamber and fresh gases are introduced into the chamber.

The matrix may consist of first and second layers respectively having hafnium (e.g. hafnium carbide) and zirconium (e.g. zirconium carbide) as the refractory materials. The matrix defines pores with the substrate and further defines an external surface. A layer of rhenium may cover the matrix in the pores and in the external surface.

The layer of hafnium carbide may be included in the matrix because hafnium carbide minimizes any reaction between the graphite fibers in the substrate and the zirconium carbide in the matrix. One reason for this is that hafnium carbide is resistant to the diffusion of carbon from the fibers into the matrix at temperatures approaching 2000° F.

The material and methods of this invention may be considered to constitute improvements of the materials and methods disclosed and claimed in U.S. Pat. No. 4,397,901. Because of this, reference may generally be made to the disclosure in U.S. Pat. No. 4,397,901 to complete the disclosure of this invention if information should be considered as missing in this application.

In one embodiment of the invention, a substrate generally indicated at 10 may be provided with porous, permeable properties. The substrate 10 may be included in an article generally indicated at 11. The substrate 10 may be formed from discrete elements 12 such as fiber or grains or a mixture of fibers and grains. The discrete elements may have a carbon or ceramic base. By way of illustration, the discrete elements may be formed from a suitable material such as pyrolyzed wool, rayon, polyacrylonitrile and pitch fibers. Carbonized rayon felt, chopped fibers of carbonized polyacrylonitrile, carbonized rayon cloth made from interwoven carbon fibers, a tape material made of closely woven, carbonized PAN fibers, a macerated material comprising a multiplicity of randomly oriented pyrolyzed wool fibers and a macerated material having a multiplicity of chopped pitch fibers are specifically capable of being used.

The substrate can also advantageously be formed from a slurry comprising granular material such as silicon carbide or graphite. Such granular material can also be mixed with short lengths of high temperature resistant fibers selected from the group consisting of ceramic, pyrolyzed wool, rayon, polyacrylonitrile and pitch. The slurry may also include a suitable carbonaceous binder such as petroleum pitch, coal tar pitch, furan resins and phenolic resins. The slurry used to form the substrate may also comprise short lengths of polyacrylonitrile fibers intermixed with silicon carbide in granular form. The different substrates described above may be formed on a continuous basis or may be formed by cyclic or pulsing techniques. When cyclic or pulsing techniques are used, a sequence of steps is provided under controlled conditions for limited periods of time and the sequence is repeated more than once.

Figures 1, 2, 3, 4:
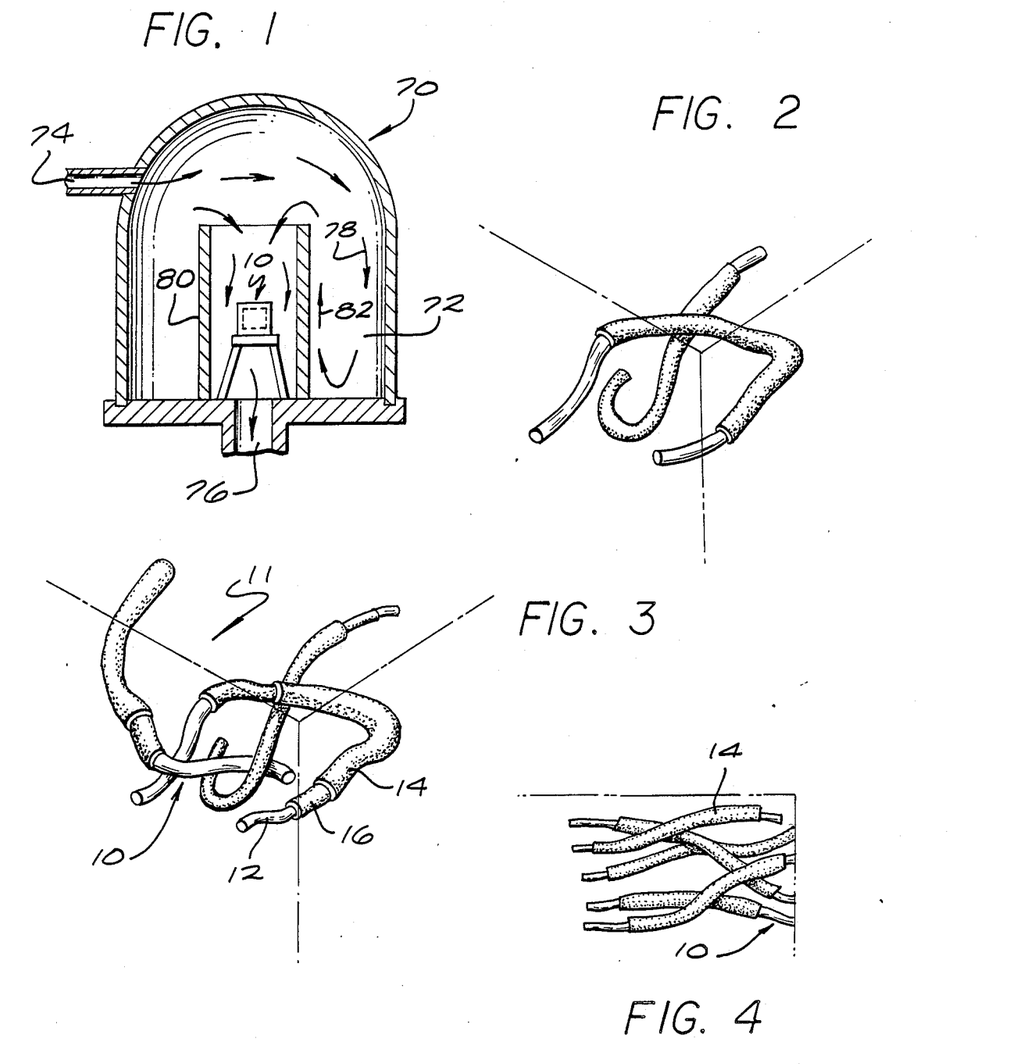
FIG. 1 is a schematic diagram of apparatus for producing the articles of this invention.
FIGS. 2 through 5 are schematic illustrations of different embodiments of articles included within this invention.

The substrate described in the previous paragraph may be directly coated with a matrix 14 as shown in FIG. 2. However, in order to coat the matrix 14 directly on the substrate 10, the substrate 10 is initially shaped preferably to a configuration corresponding to that desired for a finished article. The substrate 10 is then preferably retained in the desired configuration while the matrix 14 is being deposited on the substrate 12. This retention may be provided by a tool or fixture (not shown) which is constructed to retain the substrate 10 in the desired configuration while still providing for the coating of the matrix at every desired position on the substrate. Coating of the matrix on the substrate in this manner is advantageous in that it is direct and does not require any intermediate preparation of the substrate. However, it generally requires the preparation of special tools and fixtures. Furthermore, it increases the space requirements for the coating operation because of the use of the tools or fixtures It also tends to slow the rate at which the matrix 14 is coated on the substrate 10.

Alternatively, pyrolyzed carbon 16 may be deposited on the substrate 10, as shown in FIG. 3, before the deposition of the matrix on the substrate. The pyrolyzed carbon 16 facilitates the promotion of a good load transfer between fibers, particularly when the article is stressed. The pyrolyzed carbon 16 also helps to strengthen and stabilize the substrate 10, particularly when the article is subjected to stress. It also enhances the mechanical interface for increasing the surface fracture energy of the composite structure defining the article 11, thus enhancing the toughness and flow resistance of the refractory composite article 11.

To provide the coating 16 of pyrolyzed carbon on the substrate 10, the substrate may be disposed in a furnace of conventional design. The temperature of the substrate may then be raised to a suitable temperature such as approximately 1800° F. and a vacuum in the order of 15 mm mercury (hg) may be maintained within the deposition chamber. Pyrolyzed carbon may then be deposited about each of the discrete elements 12 in the substrate 10 by flowing methane gas through the porous substrate for an extended period of time such as about fifty (50) hours. As will be subsequently appreciated, this extended period is preferably not be continuous but is obtained by successive pulsings of the methane gas through the porous substrate.

When the pyrolyzed carbon is deposited on the substrate 10 in the manner discussed in the previous paragraph, it encases the discrete elements defining the substrate. This is illustrated schematically at 16 in FIG. 3. The layer of pyrolyzed carbon 16 is porous and permeable. With a density of the substrate in the order of 0.7 gm/cc and a fiber volume of about forty percent (40%) before the deposition of the pyrolyzed carbon 16, the substrate encased with the pyrolyzed carbon may have a density in the order of 0.9 gm/cm$^3$. The pyrolyzed carbon 16 serves to position the discrete elements 12 in the substrate 10 and to strengthen the substrate for handling purposes. In this way, the matrix 14 can be deposited on the substrate 10 without requiring any tools or fixtures to be used.

The pyrolyzed carbon 16 can be deposited on the substrate by other techniques than those discussed above. For example, the substrate 10 can be coated with any suitable and conventional type of resin such as a phenolic designated by Monsanto Chemical Company as Monsanto 1008. As a first step, the phenolic may be dissolved in a solvent such that it is fluid. The solvent may illustratively be methylethylketone. The substrate 10 may then be coated with the phenolic and partially polymerized so that it is dry to the touch.

Patterns of the desired shape can then be cut from the substrate 10 or the substrate can be heated to a temperature of at least 160° F. compressed and then cut to the desired shape. The patterns in the desired shape may then be placed in a mold and heated to a suitable temperature such as approximately 350° F. to cure the phenolic. The patterns may then be cured at a temperature above 350° F. to stabilize the system. The phenolic is then pyrolyzed at a temperature of approximately 1600° F. to decompose it to carbon, its elemental form. One reason for the pyrolysis is to prevent the substrate from thereafter emitting gases when it is heated.

Figure 5:
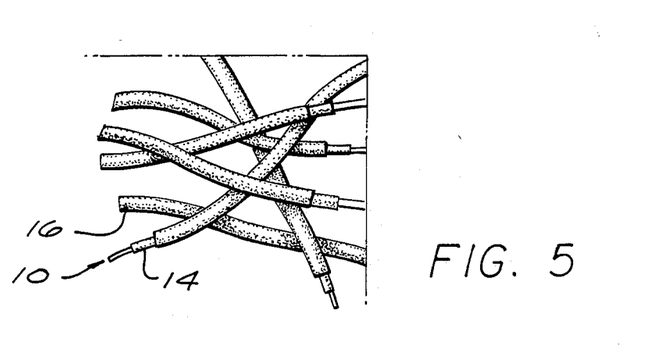
Figure 6:
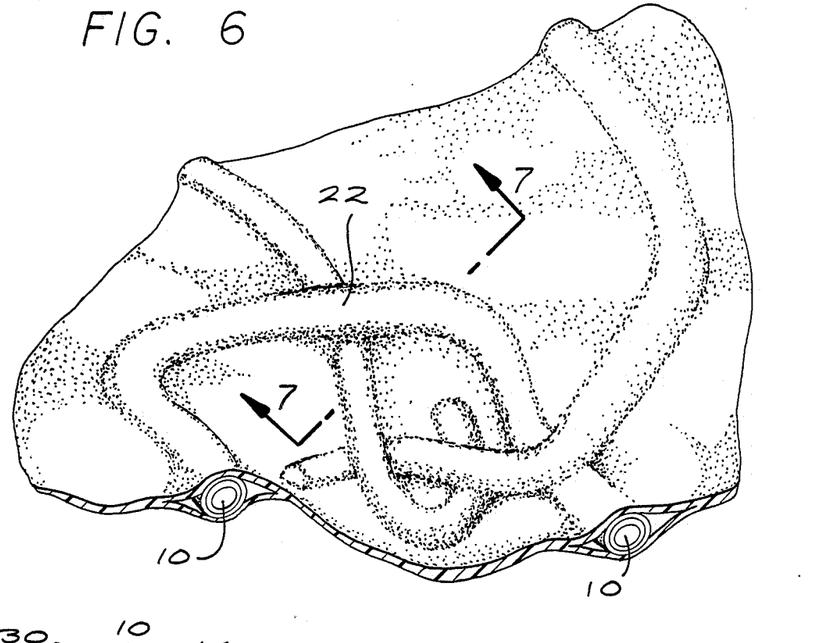
FIGS. 6 and 7 are schematic views showing a further embodiment of the invention.

In the embodiment shown in FIG. 5, the discrete elements 12 may be retained in position by the pyrolyzed carbon 16 which is disposed in the interstices between the discrete elements, as shown in FIG. 6. The deposition of the pyrolyzed carbon 16 in the interstices between the discrete elements 12 is illustrated schematically at 22 in FIG. 5. The combination of the discrete elements 12 and the pyrolyzed carbon 16 in the interstices 22 is porous and permeable. In the embodiment shown in FIG. 4, the matrix 14 is disposed in the interstices 22 without the inclusion of the pyrolyzed carbon 16.

When the binder constituting the phenolic is pyrolyzed as discussed in the previous paragraphs, it loses approximately half of its mass and it shrinks and cracks. In spite of this, the pyrolyzed carbon is able to hold the discrete elements 12 in position in the substrate and to impart strength to the substrate. The substrate 10 is then heated to a temperature of approximately 2200° F. for a relatively short period of time to impart a final shrink and pyrolyzation to the binder.

Polyurethane or polyethylene can be included in the phenolic binder before the binder is cured and pyrolyzed as discussed in the previous paragraphs. When the substrate 10 and the binder are then heated to approximately 1600° F., the polyurethane or polyethylene vaporizes and facilitates the formation of tunnels in the substrate. As will be disclosed in detail subsequently, the tunnels are effective in providing paths for depositing the matrix 14 on the substrate 10 as by chemical vapor deposition.

Instead of using a wet binder to coat the discrete elements 12, a dry binder may be used. Dow Corning Plycarbosilane 6-2330 is illustrative. This is a dry resin which may be mixed with methylethylketone to provide a fluid mixture with which to work. This material has properties of becoming partially polymerized at room temperatures. The material is mixed with the substrate and is then heated to a temperature of approximately 1600° F. to pyrolyze the binder. The material is subsequently heated to a temperature of approximately 2200° F. to provide it with a final pyrolyzation and shrink.

Sodium silicate or colloidal alumina can also be used as binders. The substrate 10 may be dipped into sodium silicate in liquid form and may then be heated. The sodium silicate flows along the lengths of the discrete elements 10 and tends to congregate or agglomerate at the interstices between the discrete elements. The formation of layers of material at the interstices between the fibers of the substrate 10 is shown in FIG. 4 and 5.

As will be appreciated, the characteristics of the substrate can be considerably varied without departing from the scope of the invention. For example, when fibers are used in a woven form, the relative numbers of threads in warp and woof can be varied in great proportions and the spacings between the threads can also be varied considerably.

When the matrix 14 is deposited on the substrate 10, it does not have any significant chemical bond with the substrate. Furthermore, any mechanical bond between the matrix 14 and the substrate 10 is relatively weak. Since a strong bond between the matrix 14 and the substrate 10 does not exist, increased surface fracture energy (toughness) is produced between the substrate and the matrix. Flaw sensitivity in the material is also reduced.

The matrix 14 also has a significantly different coefficient of thermal expansion than the substrate 10. As a result, the matrix 14 is free to move relative to the substrate 10 with mechanical shocks or changes in temperature. This is particularly important because of the considerable range of temperatures (in the thousands of degrees fahrenheit) in which the articles formed from the refractory materials of this invention are expected to work.

The matrix 14 may be disposed on the substrate 10 to encase the discrete elements 12 (see FIGS. 2 and 3). The matrix 14 may also be disposed in the interstices (FIGS. 4 and 5) between the discrete elements 12 when the pyrolized carbon 16 is disposed in such interstices. The matrix 14 may be formed from a suitable material consisting of a refractory element and an element providing negatively charged ions. The refractory element may be selected from the group consisting of hafnium, zirconium, tantalum, tungsten and molybdenum. The negatively charged element may be selected from the group consisting of nitrogen, carbon and oxygen. Refractory materials such as hafnium carbide and zirconium carbide are preferred. For example, although tantalum and tungsten are harder than hafnium and zirconium and although tantalum, tungsten and molybdenum have higher melting temperatures than hafnium and zirconium, hafnium and zirconium are more resistant to oxidation than tantalum, tungsten and molybdenum. Furthermore, hafnium and zirconium are lighter in weight than tantalum, tungsten and molybdenum.

As previously described, a metallic carbide preferably constitutes the matrix 14. The metallic carbide may be preferably formed by reducing a halide salt which may be a chloride. The chemical reaction for producing a halide salt of hafnium is as follows:

$$HfCl_4 + CH_4 \rightarrow HfC_{(s)} + 4HCl \tag{1}$$

In the above equation, hafnium chloride ($HfCl_4$), methane ($CH_4$) and hydrogen chloride (HCl) are gases and hafnium carbide (HfC) is a solid. Similarly, zirconium carbide may be obtained from zirconium chloride in the following manner:

$$ZrCl_4 + CH_4 \rightarrow ZrC + 4HCl \tag{2}$$

In the above equation, zirconium chloride ($ZrCl_4$), methane ($CH_4$) and hydrogen chloride (HCl) are gasses and zirconium carbide is a solid.

The halides of hafnium ($HfCl_4$) and zirconium ($ZrCl_4$) are preferably formed in a pre-reactor in which the metal is burned in a chlorine gas at a temperature of approximately 700° C. to 900° C. The chemical reaction is as follows for hafnium:

$$Hf + 2Cl_2 \rightarrow HfCl_4 \tag{3}$$

In the above equation, hafnium (Hf) and hafnium chloride ($HfCl_4$) are solids and chlorine ($Cl_2$) is a gas. Zirconium chloride can be produced from zirconium in a similar reaction.

While a halide salt is presently used, organometallics may be also used. For example, a reaction may occur as follows:

$$(CH_3)_X HFCl_Y + H_2 \rightarrow H_FD_{(s)} + HCl + CH + H_2$$

Where
X+Y=4
and $$R-H_F-R=H_2 \rightarrow H_FC_{(s)} + R + HCl + H_2$$

R=Ethyl Groups, Ring Compounds

To illustrate the variety of reactants that may be used, a short review of CVI SiC process chemistry development is useful.

Before more complex organometallics were economically feasible and demonstrated high purity levels, a simple chloride of silicon was used for SiC deposition:

$$SiCl_4 + CH_4 \rightarrow SiC + 4HCl \tag{5}$$

Today one of the higher order silanes such as methyl trichloro silane (MTS) or dimethyldichlorosilane (DMS) is used:

$$CH_3SiCl_3 + H_2 \rightarrow SiC_{(s)} + CH_4 + HCl + H_2 \tag{6}$$

$$(CH_3)_2 SiCl_2 + H_2 \rightarrow SiC_{(s)} + CH_X + HCl + H_2 \tag{7}$$

The reduction of hafnium chloride (HfCl$_4$) to hafnium carbide (HfC) preferably occurs in a chemical vapor infiltration (CVI) reactor at a temperature in the range of approximately 1180° F. to 1250° F. at a total pressure ranging from approximately ten (10) Torr to approximately one hundred (100) Torr. The total pressure is cycled between these values at a rate of approximately eighty three (83) seconds. In this cycle time, a backfill pressure of approximately ten (10) Torr is produced for approximately twenty three (23) seconds and a pressure of approximately one hundred (100) Torr is produced for approximately sixty (60) seconds including several seconds to change from 10 to 100 torr. The vacuum can be produced in such a cyclic manner through the inclusion of timer circuits and variable area exhaust valves between the chemical vapor infiltration (lCVI) reactor and the vacuum pumps.

Reactant ratios in the above equations are nominally on a molar basis. For example, 2.7 moles of chlorine (Cl$_2$) are included for each mole of hafnium (Hf) and 0.55 moles of methane (CH$_4$) are included for each mole of hafnium chloride (HfCl$_4$). As will be seen, a slight excess of chlorine (Cl$_2$) is provided in the above molar ratios. This slight excess of chlorine (Cl$_2$) indicates that the chlorine burn is not completely efficient. Furthermore, the molar ratio between the methane (CH$_4$) and the halide salt (e.g. HfC) demonstrates that a relatively low carbon potential is required to drive the process to a stoichiometric deposit of the halide salt (e.g. HfC).

Steady state reactor conditions are typically utilized for pyrolitic carbon infiltration of a substrate such as the substrate 10 and for some chemical vapor infiltration (CVI) processes such as the production of a silicon carbide (SiC) matrix on the substrate. Under such steady state reactor conditions, the infiltration results for producing a matrix of hafnium carbide (HfC) or zirconium carbide (ZrC) on the substrate are quite disappointing. This results from the fact that very little infiltration of the hafnium carbide (HfC) or zirconium carbide (ZrC) is developed below the apparent surface of the fibrous substrate. Typically a depth not in excess of ten (10) mils is achieved.

The pressure cycling technique discussed above between pressures such as ten Torr (10) and one hundred (100) Torr is used to augment substantially the diffusional mass transport process which is at work in a steady state chemical vapor infiltration (CVI) process. With such techniques, infiltration depths of approximately fifty (50) mils have been achieved. This has meant the difference between an impractical (the steady state) and a practical (the pressure-pulsating) process.

The increased infiltration of the hafnium carbide or zirconium carbide into the substrate 10 to form the matrix 14 may be seen from the following analysis. As the pressure of the gases in the chemical vapor infiltration (CVI) process increases, the pressure external to the substrate 10 increases on a corresponding basis. However, the pressure of the gases within the substrate 10 does not increase as fast as the pressure of the gases outside of the substrate. This may result in part from the fact that the pores in the substrate 10 are relatively small so that the pressure of the gases within the substrate 10 cannot follow the pressure of the gases outside of the substrate as the pressure of the gases increases. This differential of pressure acts upon the hafnium carbide (HfC) or zirconium carbide (ZrC) gaseous reactants to produce a flow of such material into the innermost reaches of the substrate 10 and to produce a deposit of the hafnium carbide or zirconium carbide there. This provides for a substantially uniform deposition of the hafnium carbide (HfC) and zirconium carbide (ZrC) not only on the surface of the substrate 10 but also within the interior of the substrate.

Following the introduction into the furnace or chamber of the gases containing the zirconium (or hafnium) and the carbon and the pulsation of the pressure of the gases in the furnace or chamber, the gases may be withdrawn from the furnace by producing a mild vacuum. Fresh gases containing silicon and carbon may be then introduced into the furnace. The fresh gases may then be pulsed in a manner similar to that described above.

This process may be repeated through a number of cycles until the matrix has been formed with the desired thickness.

The periodic introduction of gases into the furnace and subsequent exhaustion of these gases from the furnace provide certain important advantages. As will be seen, the composition of the gases introduced to the furnace changes with time because of the chemical reactions in the gases and because of the exhaustion of the gases as the gases are chemically reacted to produce the matrix 14. This causes the properties of the matrix 14 to vary with time. By exhausting these gases from the furnace after a relatively short period of time and subsequently introducing a new supply of such gases, relatively constant characteristics can be provided for the matrix 14 along the various macroscopic dimensions of the article being processed.

FIGS. 7-10 constitute microphotographs of the fibers in the embodiment shown in FIG. 2. The magnifications of these microphotographs are as follows:

| Figure | Magnification |
|---|---|
| 7 | 20X |
| 8 | 80X |
| 9 | 200X |
| 10 | 1250 |

Figure 8:
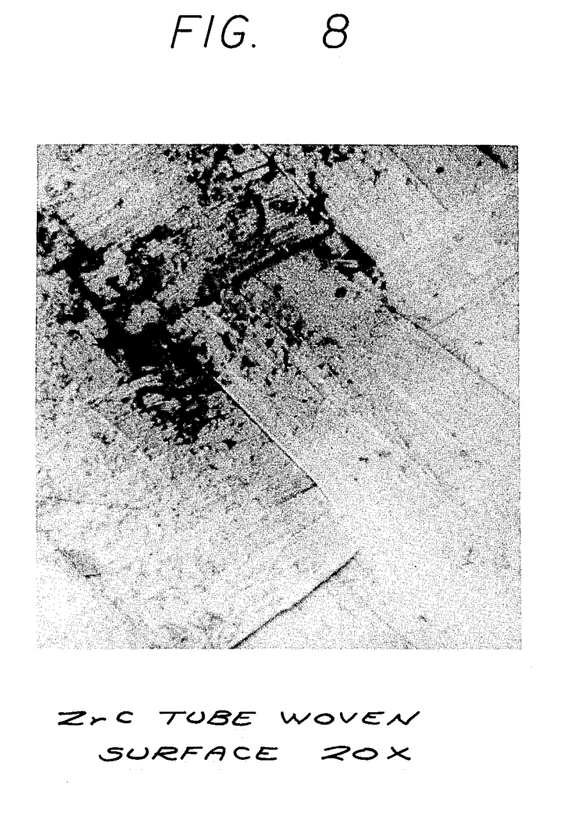
FIGS. 8 through 11 are microphotographs of individually coated fibers in the embodiment shown in FIGS. 6 and 7 with progressive magnifications of the fibers in each of the successive microphotographs.
Figure 9:
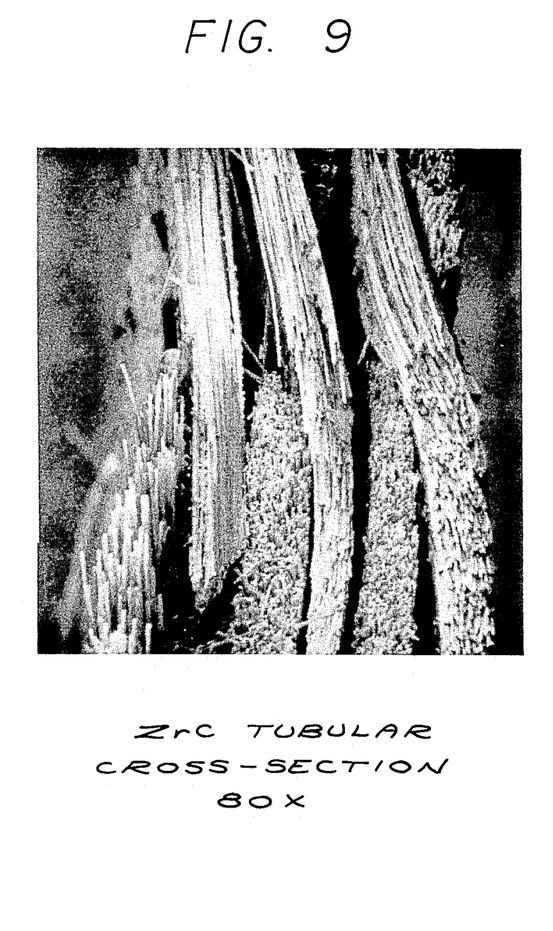
Figure 10:
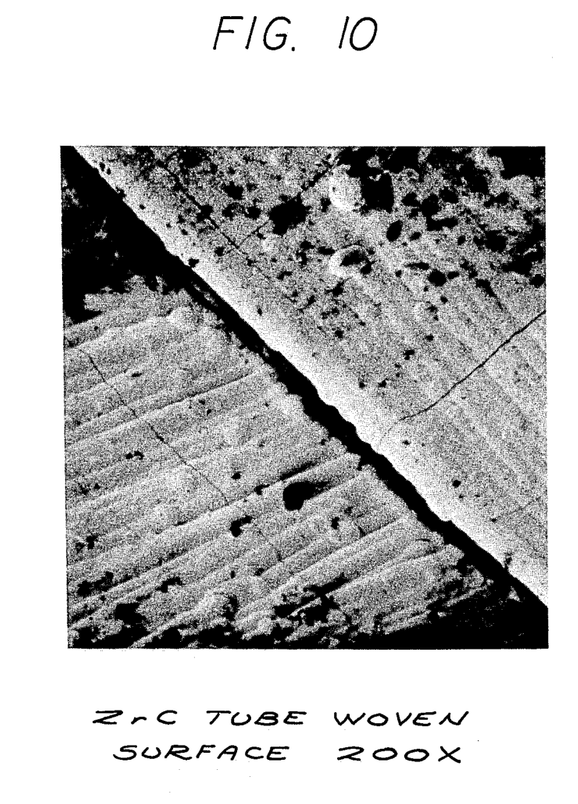
Figure 11:
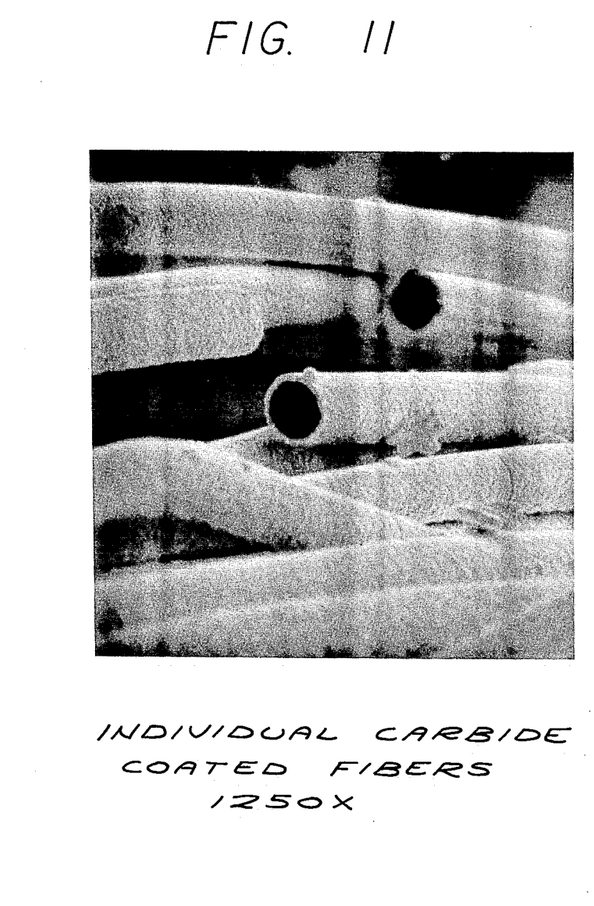

In the above table, "X" represents the magnification from actual size. All of these Figures show the deposition of zirconium carbide as the matrix 14 on carbon fibers in the substrate 10. As will be seen, the zirconium carbide in the matrix 14 encases the carbon fibers in the substrate 10. FIG. 8 at a magnification of eighty (80) shows the disposition of bundles of fibers. FIGS. 10 and 11 are sufficiently magnified so that individual fibers are shown and these individual fibers are shown as being encased.

The material disclosed can be used in a number of different equipments including nuclear reactors. The material is particularly adapted to be used in nuclear fission reactors. Key elements in such a reactor are shown schematically in FIG. 12. These key elements include a wall 30 made from a material which is known in the art. For example, the wall 30 may be made from stainless steel or a nickel-based alloy containing nickel, cobalt and chromium. The wall 30 may also be made from a material which is ceramic-based if the temperature of the wall 30 is elevated. Since the wall 30 does not receive any heat, it does not have to have refractory properties. The wall 30 may be provided with spaced bores 32 extending longitudinally through the wall at periodically spaced positions. The bores 32 may have suitable dimensions such as a heighth of approximately twenty four thousandths of an inch (0.024") and a width such as approximately twelve thousandths of an inch (0.012").

Figures 7, 12:
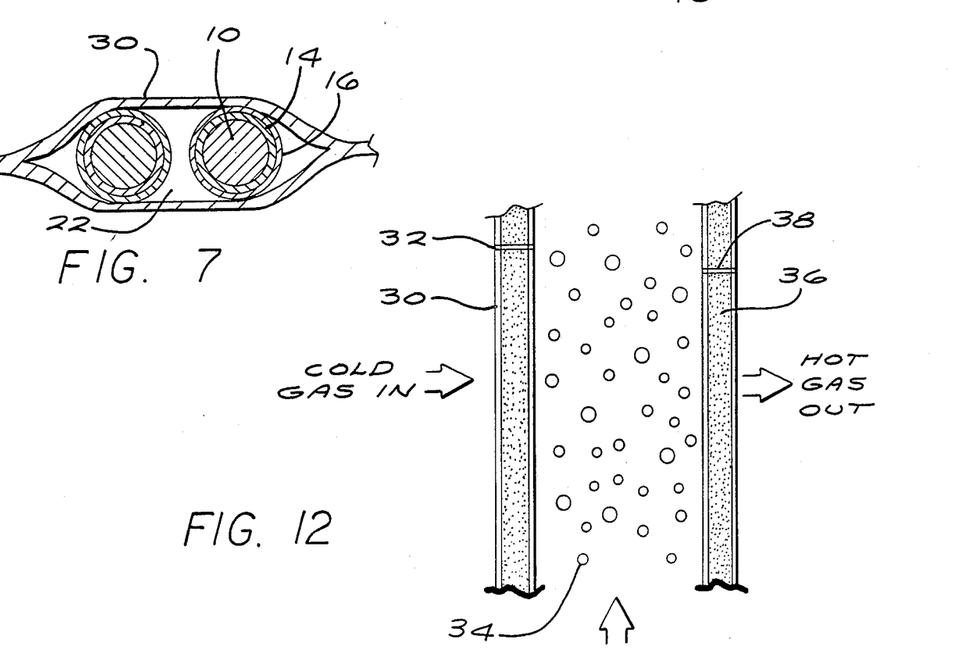
FIG. 12 is a sectional view illustrating the construction of a nuclear furnace in additional detail, this nuclear furnace including, as one wall, the embodiment shown in FIGS. 6–11.

Particles 34 of a nuclear fuel may be disposed adjacent the wall 30. The particles 34 may be made from a suitable material such as uranium carbide coated with zirconium carbide. This material provides a nuclear fission. The particles 34 may be packed to a density approaching sixty percent (60%) and may be provided with a suitable diameter such as approximately twenty thousandths of an inch (0.020"). The particles 34 may be disposed in a column to a height of approximately two feet (2').

A wall 36 made from the material of this invention is disposed in abutting relationship to the particles 34 on the other side of the particles from the wall 30. The wall 36 may be provided with bores 38 at periodically spaced positions in the bores. The bores 38 may have suitable dimensions such as a height of approximately twenty four thousandths of an inch (0.024") and a width such as approximately twelve thousandths of an inch (0.012").

As will be seen, the walls 30 and 36 are preferably cylindrical and concentric. Preferably the wall 36 is disposed internally of the wall 30 but the positions of the walls 30 and 36 can be reversed so that the wall 36 is external to the wall 30. The wall 36 is preferably internal to the wall 30 because the wall 36 is difficult and expensive to make and because it is difficult to make the wall 36 compatible with the gases passing through the wall.

A cold gas such as hydrogen, xenony argon or helium is passed through the bores 32 in the wall 30. The cold gas receives heat from the nuclear fission which is occurring in the particles 34. The heated gas then passes through the bores 36 in the wall 34. The gas is then drawn downwardly in the space within the wall 34 to another position where the heat in such gas is extracted to perform work such as to generate electricity.

The wall 34 can become degraded as by hydrogen corrosion if it is not constructed properly. For example, hydrogen corrosion can occur through the following chemical reaction:

$$MeC + H_2 \rightarrow Me + CH_X \qquad (4)$$

In the above equation, "Me" is intended to designate a metal on a general basis, and "X" is intended to indicate any suitable integer such as 4. In the above equation, the metal carbide is a solid, the hydrogen and the hydrocarbon is a gas and the metal may be a liquid. As will be appreciated, it is not desirable for the above chemical reaction to occur because the refractory composite material forming the wall 34 will progressively disappear. Furthermore, the liquid metal will clog the pores in the refractory composite material and also clog the holes 36 in the wall 34 and inhibit the passage of the hot gases through the wall With respect to hydrogen corrosion, hafnium carbide has a better response than zirconium carbide. However, rhenium has an even better response than hafnium carbide.

The wall 34 can also become degraded by metalorcarbon diffusion at temperatures in excess of approximately 2500° K. to 3000° K. For example, metal diffusion can occur through the following chemical reaction:

$$MeC + C \rightarrow MeC_{1.X} \qquad (8)$$

In the above equation, "Me" is intended to indicate a metal on a 6 general basis as in equation 4, and "X" is intended to indicate any integral number. In the above reaction, the metal carbide is a solid, the carbon is a solid, the hydrocarbon is a gas and the metal is a liquid. The carbon in the chemical reaction may be obtained from the fibers in the substrate 10. The result of such a reaction is damage to graphite fibers which weaken the composite structure drastically and also, as the ceramic matrix composition changes, its physical properties change. With respect to the above reaction, hafnium carbide is better than zirconium carbide, and both hafnium carbide and zirconium are better than rhenium. Metal diffusion is undesirable for the same reasons as discussed in the previous paragraph. It is also undesirable because it robs the substrate of the carbon in the substrate and accordingly weakens the wall 34.

The result of a reaction such as reaction (8) is to damage the graphite fibers in the substrate. This weakens the composite structure significantly. Furthermore, as the ceramic matrix composition changes, the physical properties of the matrix changes. For example, the meeting temperature of the hafnium carbide may change significantly if it is either substantially metal rich or metal poor.

As will be seen from the discussion in the previous two (2) paragraphs, it is desirable that the matrix 14 in the refractory composite material constituting the wall 34 be formed from a combination of different materials. Specifically, it would be advantageous for the wall 34 to be formed from a combination of different materials. For example, it would be advantageous for the matrix 14 in the refractory composite material constituting the wall 34 to be formed from successive layers of hafnium carbide, zirconium carbide and rhenium. This is particularly true since zirconium carbide has the further advantage that it is neutral to the neutrons passing through the nuclear reactor. The inclusion of a layer of zirconium carbide in the matrix 14 is accordingly desirable because otherwise some of the neutrons passing through the wall 34 would be absorbed. This would tend to decrease the efficiency of the nuclear reactor.

When the refractory composite material of this invention is used as the wall 34 in a nuclear reactor, the matrix 14 may be formed by a layer 50 of hafnium carbide, a layer 52 of zirconium carbide and a layer 54 of rhenium. The thickness of the layer 50 of hafnium carbide may be in the order of approximately two tenths of a micron (0.2 $\mu$) to four tenths of a micron (0.4 $\mu$). The thickness of the zirconium carbide layer 52 may be in the order of approximately two microns (2 $\mu$). The thickness of the rhenium layer 54 may be in the order of approximately are half of a micron (0.5 $\mu$). As will be seen, most of the thickness of the matrix 14 is in the zirconium carbide because the zirconium carbide is neutral to the neutrons passing through the wall 34.

The rhenium layer 54 may be formed on the matrix 14 by a pyrolitic process. In this process, a halide of rhenium such as rhenium chloride may be decomposed to form rhenium and the halide gas such as chlorine. To obtain the rhenium chloride for the pyrolitic reaction, rhenium is "burned" in chlorine at a suitable temperature such as a temperature in the range of approximately 750° F. to approximately 850° F. The "burning" may be obtained by using compacted rhenium pellets since solid rhenium has so little surface area that an exothermic chlorinization process will not sustain itself. The range of the temperatures to produce this decomposition reaction may be in the order of approximately 2250° F. to approximately 2450° F. Instead of the reactions specified above, hydrogen reduction of rhenium chloride may be used at temperatures in a range of approximately 1150° C.–1200° C. to produce a rhenium layer in the matrix.

The reaction to form the rhenium layer may occur in a chemical vapor infiltration (CVI) process as described above for hafnium carbide and zirconium carbide. Preferably the reaction is not pulsed as described above for zirconium carbide and hafnium carbide since deep penetration of the rhenium into the micropores of the article is not necessary to obtain a suitable performance of the article. The rhenium does not encase the fibers such as occurs in the deposition of the hafnium carbide and the zirconium carbide on the substrate. Instead, the rhenium is deposited on the external surface of the substrate 10 and along the internal surfaces defining the pores of the substrate. This is illustrated in FIGS. 6 and 7.

In order to deposit the rhenium to the desired depth in the matrix 14, a considerable dilution of the rhenium and low total pressure levels are desirable to avoid surface deposition at the expense of infiltration. Absolute pressure ranges from less than one (1) torr to twenty five (25) torr are preferably utilized However, an inert gas such as argon preferably comprises approximately eighty percent (80%) to ninety percent (90%) of the total reactant flow on the basis of mass per unit of time. In other words, the effective concentration of rhenium in the gas phase is roughly an order of magnitude lower than the concentration of gases in the infiltration of compounds of tungsten, tantalum or molybdemum by the hydrogen reduction of the metal.

The deposition of rhenium, molybdenum, tantalum or tungsten on the matrix 14 may be seen from the following chemical reactions:

$$Me + Cl_2 \rightarrow MeCl_X \quad (9)$$

$$MeCl_X + XH_2 \rightarrow Me + HCl \quad (10)$$

FIG. 1 illustrates a schematic diagram of a furnace, generally indicated at 70, which may be used to produce the composite materials described above. The furnace 70 includes an enclosure 72 having an inlet 74 and an outlet 76. Gases, such as those used to produce a chemical vapor deposition of the matrix 14 on the substrate 10, are introduced into the furnace 70 through the inlet 74. The gases flow downwardly along the walls defining the enclosures as indicated by arrows 78. The gases then flow upwardly along a partition 80, as indicated by arrows 82. Since the path defined by the arrows 78 and 82 within the furnace 80 is relatively long, the gases have a considerable opportunity to become heated to the temperature of the furnace 80. The gases then flow downwardly within the space defined by the partition 80 and flow from the furnace 70 through the outlet 76. During the flow of the gases within the partition 80, the gases have an opportunity to become deposited on the article, such as the substrate 10, on which a deposition is to be provided.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination,
a substrate formed from a plurality of discrete elements having a porous relationship, and
a matrix disposed on the substrate with a minimal chemical and mechanical bonding to the substrate and having a different coefficient of thermal expansion than that of the substrate to provide for changes in position of the matrix relative to the substrate with changes in temperature and with the imposition of mechanical shocks on the substrate, the matrix being formed from an element having refractory properties and selected from the group consisting of hafnium, zirconium, tantalum, tungsten and molybdenum and from another element chemically bonded to the refractory element.

2. In a combination as set forth in claim 1,
the matrix being formed from a first layer disposed on the substrate and including hafnium as the refractory element and from a second layer disposed on the first layer and including zirconium as the refractory element.

3. In a combination as set forth in claim 2,
the first layer having a thickness of less than one (1) micron and the second layer having a thickness greater than one (1) micron.

4. In a combination as set forth in claim 2,
the substrate being formed from carbon fibers,
the first layer of the matrix being formed from hafnium carbide, and
the second layer of the matrix being formed from zirconium carbide.

5. In a combination as set forth in claim 4,
a layer of rhenium disposed on the matrix.

6. In combination,
a fibrous substrate having a first coefficient of thermal expansion and defining porous characteristics and formed from discrete elements having anisotropic properties,
a matrix formed from a refractory material and having a second coefficient of thermal expansion different from the first coefficient of thermal expansion, the matrix accommodating the substrate, as a result of mechanical shocks and changes in temperature, to relieve stresses between the matrix and the substrate in accordance with the differences in their coefficients of thermal expansion, the refractory material including a first element having refractory properties and selected from the group consisting of hafnium, zirconium, tantalum, tungsten and molybdenum and further including a second element chemically bound to the first element.

7. In a combination as set forth in claim 6,
a layer of rhenium disposed on the matrix to resist corrosion from hydrogen gases.

8. In a combination as set forth in claim 7,
the matrix being formed from at least two (2) layers, one of the layers including hafnium as the refractory element in the layer and the other layer including zirconium as the refractory element in the layer.

9. In a combination as set forth in claim 8,
the layer in the matrix including hafnium as the refractory element having a thickness less than one (1) micron and the layer of the matrix including zirconium as the refractory element having a thickness greater than one (1) micron.

10. In a combination as set forth in claim 6,
the matrix encasing the discrete elements in the substrate.

11. A method of forming a refractory composite material including the following steps:
forming a porous substrate from a plurality of discrete elements having a coefficient of thermal expansion and having anisotropic properties,
providing a mixture of a first gas containing a refractory element selected from the group consisting of hafnium, zirconium, tantalum, tungsten and molybdenum and a second gas containing an element having properties of reacting with the refractory element to form a refractory material having a second coefficient of thermal expansion different from the first coefficient of thermal expansion,
disposing the porous substrate in a furnace, and
introducing into the furnace the mixture at an elevated temperature and with a pressure pulsating at a particular rate between first and second limits of pressure to obtain a deposition of the refractory material on the discrete elements in the substrate with a minimal chemical or mechanical bonding to the discrete elements in the substrate.

12. A method as set forth in claim 11 wherein
a first layer of hafnium chloride is formed on the substrate by the pulsations in pressure on a mixture of gases and a second layer of zirconium chloride is formed on the layer of hafnium chloride by the pulsations in pressure on a mixture of gases.

13. A method as set forth in claim 12 wherein
a layer of rhenium is formed on the layer of zirconium chloride by the pulsations in pressure on a mixture of gases.

14. A method as set forth in claim 12 wherein
the refractory material is deposited on the substrate to encase the discrete elements in the substrate.

15. A method as set forth in claim 12 wherein
the refractory material is deposited on the substrate to cover the interstices between adjacent fibers in the substrate.

16. A method of forming a refractory composite material, including the following steps:
forming a porous substrate from a plurality of discrete elements having a first coefficient of thermal expansion and having anisotropic properties,
providing a mixture of a first gas containing a refractory element selected from the group consisting of hafnium, zirconium, tantalum, tungsten and molybdenum and a second gas containing an element having properties of reacting with the refractory element to form a refractory material having a second coefficient of thermal expansion different from the first coefficient of thermal expansion,
disposing the porous substrate in a furnace, and
introducing into the furnace the mixture at an elevated temperature and with a pressure pulsating at a particular rate between first and second limits of pressure to obtain a deposition of the refractory material on the discrete elements in the substrate with a minimal chemical or mechanical bonding to the discrete elements.

17. A method as set forth in claim 16, including:
initially introducing into the furnace the mixture with hafnium as the refractory element and with the pulsating pressure to obtain a deposition of the refractory material on the discrete elements in the substrate with a minimal chemical and mechanical bonding to the discrete elements in the substrate, and
subsequently introducing into the chamber the mixture with zirconium as the refractory element and with the pulsating pressure to obtain a deposition of the refractory material on the hafnium refractory material.

18. A method as set forth in claim 16 wherein
the hafnium refractory material is deposited on the discrete elements of the substrate with a thickness of less than one (1) micron and wherein the zirconium refractory material is deposited on the hafnium refractory material with a thickness greater than one (1) micron.

19. A method as set forth in claim 15 wherein
rhenium is deposited in the chamber on the refractory material.

20. A method as set forth in claim 16 wherein
the discrete elements in the substrate include carbon fibers and wherein
the hafnium refractory material constitutes hafnium carbide and wherein
the zirconium refractory material constitutes zirconium carbide.

21. A method as set forth in claim 17 wherein
the discrete elements in the substrate include carbon fibers and wherein
the hafnium refractory material constitutes hafnium carbide and wherein
the zirconium refractory material constitutes zirconium carbide and wherein
rhenium is deposited in the furnace on the zirconium carbide.

22. In combination,
a fibrous substrate having a first coefficient of thermal expansion and having porous characteristics and formed from discrete elements having anisotropic properties,
a matrix formed from a refractory material encasing the discrete elements and having a second coefficient of thermal expansion different from the first coefficient of thermal expansion and having a minimal chemical and mechanical bonding to the discrete elements to provide for a displacement of the matrix relative to the substrate with mechanical shock or changes in temperature, the refractory material including a first element having refractory properties and selected from the group consisting of hafnium, zirconium, tantalum, tungsten and molybdenum and further including a second element chemically bound to the first element, the matrix defining pores with the substrate and further defining an external surface, and
a layer of rhenium covering the matrix in the pores and on the external surface.

23. A combination as set forth in claim 22,
the refractory material being selected from the group consisting of hafnium carbide and zirconium carbide.

24. In a combination as set forth in claim 22,
the matrix being formed from a layer of hafnium carbide and then a layer of zirconium carbide.

* * * * *